United States Patent [19]

Harley

[11] Patent Number: 5,168,154
[45] Date of Patent: Dec. 1, 1992

[54] ELECTRICAL AVALANCHE PHOTODIODE QUENCHING CIRCUIT

[75] Inventor: Phillip E. Harley, Newcastle Upon Tyne, England

[73] Assignee: Kidde-Graviner Limited, Derby, England

[21] Appl. No.: 761,820

[22] PCT Filed: Mar. 16, 1990

[86] PCT No.: PCT/GB90/00403
§ 371 Date: Oct. 28, 1991
§ 102(e) Date: Oct. 28, 1991

[87] PCT Pub. No.: WO90/11647
PCT Pub. Date: Oct. 4, 1990

[30] Foreign Application Priority Data

Mar. 22, 1989 [GB] United Kingdom ............... 890665

[51] Int. Cl.$^5$ ............... G01J 1/44; H01L 31/02; H04B 9/00
[52] U.S. Cl. ............... 250/214 R; 307/311
[58] Field of Search ........... 250/214 A, 214 C, 214 R; 307/311; 357/13

[56] References Cited

U.S. PATENT DOCUMENTS

| | | | |
|---|---|---|---|
| 4,001,614 | 1/1977 | Dahlinger | 307/311 |
| 4,479,052 | 10/1984 | Suzuki | 307/311 |
| 4,730,128 | 3/1988 | Seki | 307/311 |
| 4,945,227 | 7/1990 | Jones et al. | 250/214 R |
| 4,963,727 | 10/1990 | Cova | 250/214 R |

Primary Examiner—David C. Nelms
Assistant Examiner—S. B. Allen
Attorney, Agent, or Firm—Leydig, Voit & Mayer

[57] ABSTRACT

An electrical quenching circuit for detecting, and quenching, avalanches in an avalanching device (5), comprises a TTL comparator (14) having one of its inputs (24) fed with a predetermined potential via a potential divider (18,20) and a voltage reference (22). When a switchable current source (6) is in its low impedance state, and when the device (5) is quiescent, diodes (10 and 16) conduct and input (12) is held at the potential of the voltage reference (22). Comparator (14) is in one stable state. Variations in the voltage reference affect both comparator inputs substantially equally. When the device (5) avalanches, the current from source (6) is diverted through the device and the diodes (10 and 16) cease to conduct. The potential at comparator input (12) falls and, at a critical value, switches the comparator to its other stable state. This is indicated by a pulse on line (34). The output on line (28) switches current source (6) into its high impedance state and quenches the avalanche in the device (5). A time-delayed output to diode (32) raises the potential at the comparator input (12) so as to switch the comparator back to its initial state.

9 Claims, 1 Drawing Sheet

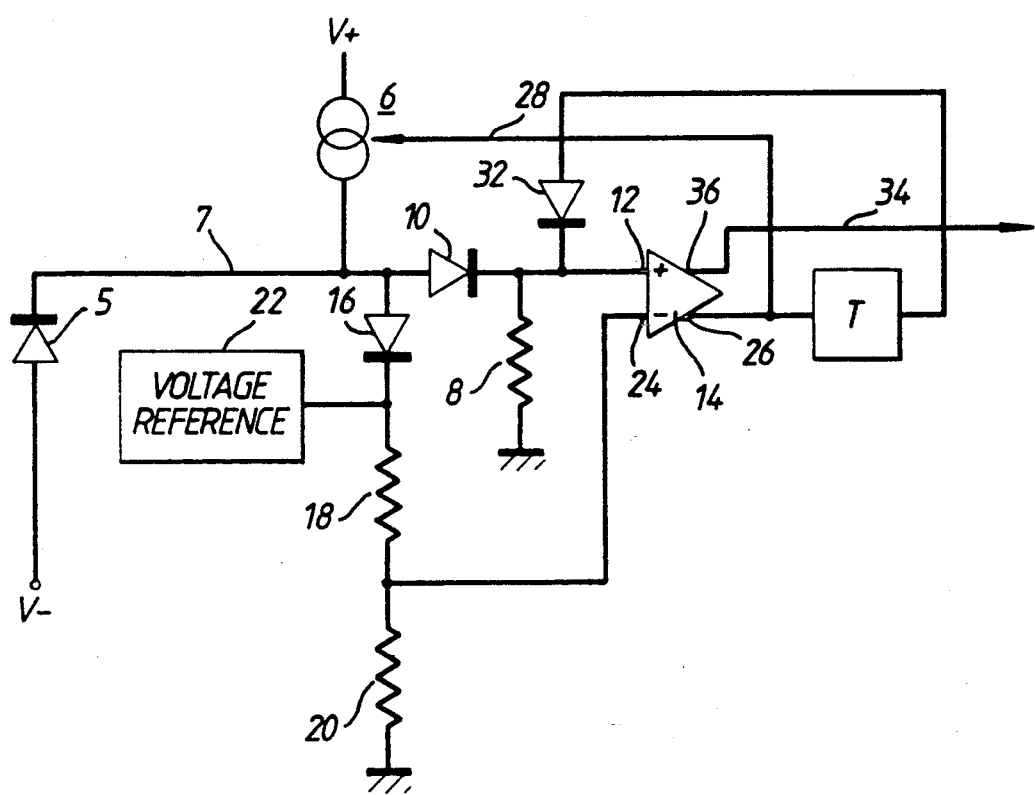

ELECTRICAL AVALANCHE PHOTODIODE QUENCHING CIRCUIT

BACKGROUND OF THE INVENTION

The invention relates to electrical quenching circuits. Such circuits may, for example, be used in conjunction with an avalanche-type photo-detecting device for detecting a photon-induced avalanche in the device and for re-setting the device to enable detection of a following avalanche, each avalanche detected producing a corresponding electrical output.

SUMMARY OF THE INVENTION

According to the invention, there is provided an electrical quenching circuit for detecting, and quenching, avalanches in an avalanching device, comprising a comparator having a first input connected to the avalanching device to detect avalanching by comparing the potential at the device with a reference potential, a switchable device connected to the avalanching device and switchable from a normal state into a quenching state in which it quenches avalanching of the device, and circuit means responsive to the output of the comparator when avalanching of the device is detected to switch the switchable device into the quenching state, characterised in that the switchable device is a switchable current source whose normal state is a high current state and which is also connected to a further circuit path which receives current from the source when the avalanching device is not avalanching, whereby avalanching of the device causes a diversion of the current from the further circuit path and into and through the avalanching device so as to change the potential at the avalanching device and to cause detection of the avalanching by the comparator, and in that the quenching state of the current source is a state in which the current is switched off.

BRIEF DESCRIPTION OF THE DRAWING

An electrical avalanche-detecting and quenching circuit embodying the invention will now be described, by way of example only, with reference to the accompanying drawing which is a circuit diagram of the circuit.

DESCRIPTION OF PREFERRED EMBODIMENTS

The circuit is for detecting avalanches in a photo-detector device 5, such avalanches being induced by a detected photon event or a thermally generated event in the device. The circuit produces an output which records each such avalanche (and thus the event which caused it) and then rapidly quenches the avalanche so as to reset the device and permit it to detect the next event.

The circuit comprises a current source 6 which is switchable between low and high impedance states, the current source 6 being connected to supply current via line 7 to the photo-detector device 5 when it avalanches, thus acting as a low impedance (approximately 1K ohm) load. The current source 6 is also connected to ground through a resistor 8 and a high speed switching diode 10, their junction being connected to the non-inverting input 12 of a comparator 14. The comparator 14 is of the transistor-transistor logic (TTL) type. A parallel path to ground is connected via a high speed switching diode 16 and resistors 18 and 20. The junction between diode 16 and resistor 18 is connected to the output of a voltage reference unit 22. The junction between resistors 18 and 20 is connected to the inverting input 24 of comparator 14. The inverting output 26 of the comparator 14 is connected via a line 28 to control the switching of the current source 6 between its low and high impedance states. In addition, this output is fed through a time delay circuit 30 and a diode 32 back to the inverting input 12 of the comparator 14 in order to reset the circuit as will be explained.

A line 34 connected to the non-inverting output 36 of comparator 14 produces the avalanche-indicating output of the circuit.

In the quiescent state of the photo-detecting device 5, current source 6 is in its low impedance state. Current from the source flows through diode 16 to the voltage reference 22 and also flows through diode 10 and resistor 8 to ground. The value of resistor 8 is such that the current divides substantially equally between the two diodes 16 and 10. Line 7 is held substantially at the voltage of the voltage reference unit 22 and this same voltage is present at the non-inverting input 12 of the comparator 14, subject to small differences caused by any mis-matching of the diodes 10 and 16. In addition, a very small leakage current flows into the device 5 from the current source 6.

The voltage at the inverting input 24 of the comparator 14 will be less than the reference voltage provided by voltage reference unit 22 by an amount determined by the ratio of the resistors 18 and 20.

In this state, therefore, the comparator 14 produces a HIGH output at its non-inverting output 36 and a LOW output at its inverting output 26. The LOW output on line 28 holds the current source in its low impedance state and, via delay unit 30, holds the reset diode 32 non-conducting.

To a first order, variations in the voltage output of the voltage reference unit 22 will be applied equally to the two inputs of the comparator 14.

When an avalanche occurs in the photo-detector device 5, the result will be to divert the current from the voltage source 6 into the device 5. Diode 16 will cease to conduct and the potential on line 7 and at the non-inverting input 12 of the comparator 14 will descend towards ground potential. When it reaches a critical value, below the potential at the inverting input 24 (which is determined by the voltage reference from the voltage source 22 and the potential divider formed by resistors 18 and 20), the comparator 14 switches over so that the states of its two outputs change.

Therefore, the inverting output 26 will go HIGH. Via line 28, this will turn off the current source 6 and raise its impedance so that there is no longer an avalanche-sustaining current for the photo-detecting device 5. The avalanche is thus quenched In addition, no more current is available for resistor 8 and this reinforces the switching action of the comparator 14.

The HIGH output at the inverting output 26 of the comparator 14 passes through the delay unit 30, after a fixed time delay T, which is characteristic of the device 5, and initiates the reset function via diode 32. This diode conducts, causing current to flow through resistor 8 and thus raising the potential of the non-inverting input 12 of the comparator above the critical threshold. The comparator thus switches back so that the inverting output 26 goes LOW, switching current source 6 back to its low impedance state. Initially, current continues to flow into the photo-detector device 5 to recharge its inherent capacitance. After a short time (which must be less than T), the original quiescent conditions are re-established. The LOW output from the inverting output 26 of the comparator passes through the time delay unit 30 after the time delay T and switches diode 32 back to its non-conducting state.

During this process, the non-inverting output 36 on line 34 goes LOW to provide an output, TTL compatible, pulse indicative of the fact that quenching has taken place.

Diode 10 performs a secondary function of protecting the non-inverting input 12 of comparator 14 from potentially damaging values of potential below ground.

The ratio of the values of resistors 18 and 20 is designed to provide a suitable noise-discriminating threshold for the circuit.

The use of a TTL comparator (comparator 14) considerably simplifies the quenching circuit as compared with the use of an emitter-coupled-logic (ECL) type of comparator. Although the TTL comparator is slower in operation than an ECL comparator, there is little overall speed penalty because the ECL device requires additional level shifting stages which introduce delay and excessive complexity and current consumption.

I claim:

1. An electrical quenching circuit for detecting, and quenching, avalanches in an avalanching device (5), comprising a comparator (14) having a first input (12) connected to the avalanching device (5) to detect avalanching by comparing the potential at the device (5) with a reference potential (22), a switchable device (6) connected to the avalanching device (5) and switchable from a normal state into a quenching state in which it quenches avalanching of the device (5), and circuit means (28) responsive to the output of the comparator (14) when avalanching of the device (5) is detected to switch the switchable device (6) into the quenching state, characterised in that the switchable device is a switchable current source (6) whose normal state is a high current state and which is also connected to a further circuit path (10,16) which receives current from the source (6) when the avalanching device (5) is not avalanching, whereby avalanching of the device (5) causes a diversion of the current from the further circuit path (10,16) and into and through the avalanching device (5) so as to change the potential at the avalanching device (5) and to cause detection of the avalanching by the comparator (14), and in that the quenching state of the current source (6) is a state in which the current is switched off.

2. A circuit according to claim 1, characterised in that the further circuit path comprises diode means (10,16) rendered conductive when the current source (6) is in its high current state and which is connected to the voltage reference (22) and a potential divider (18,20), and in that the comparator (14) has its first input (12) connected to the reference potential (22) via the conducting diode means (10,16) and having the second (24) of its inputs connected to the voltage reference (22) via a point on the potential divider (18,20), such that the said diversion of the current into and through the device (5) when it avalanches renders the diode means (10,16) non-conductive thereby causing the potential at the first input (12) of the comparator (14) to change towards and to cross the potential at the second input (24) thus switching the comparator (14) into a state signifying detection of the avalanching, and in that the circuit means (28) comprises circuit means responsive to such switching to switch the current source (6) to its switched-off state thereby quenching the avalanche.

3. A circuit according to claim 2, characterised by a feedback path (30,32) responsive to the switching of the comparator (14) into its avalanche detecting state to change the potential at the first comparator input (12) back towards its previous value thereby switching the comparator (14) out of the avalanche detecting state and switching the current source (6) back to its high current state.

4. A circuit according to claim 3, characterised by an impedance (8) connecting the first input (12) of the comparator (14) to a datum potential and in that the feedback path (30,32) comprises means operative when the comparator (14) switches to its avalanche-detecting state to connect an output (26) from the comparator (14) to the first input (12) thereof so as to cause a current to flow through the impedance (8) and thereby shift the potential at the first input (12) of the comparator (14) back towards the said previous value.

5. A circuit according to claim 4, characterised in that the feedback path includes a time delay circuit (30) having a predetermined time delay dependent on the characteristics of the avalanching device (5).

6. A circuit according to any one of claims 2 to 5, characterised in that variations in the voltage reference (22) when the comparator (14) is not in its avalanche-detecting state substantially equally affect both comparator inputs (12,24).

7. A circuit according to any one of claims 2 to 6, characterised in that the diode means comprises a first diode (10) connecting the output of the current source (6) to the first comparator input (12) and a second diode (16) connecting the output of the current source (6) to the reference potential (22) and to the potential divider (18,20).

8. A circuit according to any one of claims 2 to 7, characterised by a circuit path (34) connected to an output (36) of the comparator (14) to produce an output pulse, indicating avalanching of the device (5), when the comparator (14) changes into its avalanching detecting state.

9. A circuit according to any preceding claim, characterised in that the comparator is a TTL-type comparator (14).

* * * * *